United States Patent [19]

Honna

[11] Patent Number: 5,235,201

[45] Date of Patent: Aug. 10, 1993

[54] SEMICONDUCTOR DEVICE WITH INPUT PROTECTION CIRCUIT

[75] Inventor: Katsu Honna, Kawasaki, Japan

[73] Assignee: Kabushiki Kaisha Toshiba, Kawasaki, Japan

[21] Appl. No.: 888,029

[22] Filed: May 26, 1992

[30] Foreign Application Priority Data

May 27, 1991 [JP] Japan .................................. 3-121355

[51] Int. Cl.$^5$ ............................................. H01L 27/02
[52] U.S. Cl. ................................... 257/357; 257/133; 257/173; 257/328; 257/355
[58] Field of Search ................ 357/42; 257/133, 173, 257/328, 355, 357

[56] References Cited

U.S. PATENT DOCUMENTS 4,626,882  12/1986  Cottrell et al. ........................ 257/357

Primary Examiner—Edward Wojciechowicz

Attorney, Agent, or Firm—Finnegan, Henderson, Farabow, Garrett & Dunner

[57] ABSTRACT

An N channel type MOSFET is formed in a P type semiconductor substrate. A drain of the N channel type MOSFET is connected to a $V_{DD}$ line. A P$^-$ type impurity layer is formed in contact with the drain of the N channel type MOSFET. An input protection circuit is formed in the P type semiconductor substrate. The input protection circuit comprises a diode $D_1$ in which a cathode is connected to an input terminal and an anode is connected to a $V_{SS}$ line, and a diode $D_2$ in which a cathode is connected to the $V_{DD}$ line and an anode is connected to the $V_{SS}$ line. The anode of the diodes $D_1$ and $D_2$ comprises a P$^-$ type impurity layer. Impurity concentration of the P$^-$ type impurity layer the diodes $D_1$ and $D_2$ are higher than that of the P$^-$ impurity layer formed in contact with the drain of the N channel type MOSFET. The anode can be used in common to both diodes $D_1$ and $D_2$.

6 Claims, 13 Drawing Sheets

PRIOR ART

SEMICONDUCTOR DEVICE WITH INPUT PROTECTION CIRCUIT

BACKGROUND OF THE INVENTION

2. Field of the Invention

The present invention relates to improvement of a CMOS semiconductor device having an input protection circuit.

2. Description of the Related Art

Conventionally, two types of input protection circuits are known, one in which a diode is connected between an input terminal and a $V_{DD}$ line and a diode is connected between an input terminal and a $V_{SS}$ line; and the other in which a dummy transistor is connected between an input terminal and a $V_{DD}$ line and a dummy transistor is connected between an input terminal and a $V_{SS}$ line.

Figure 1:
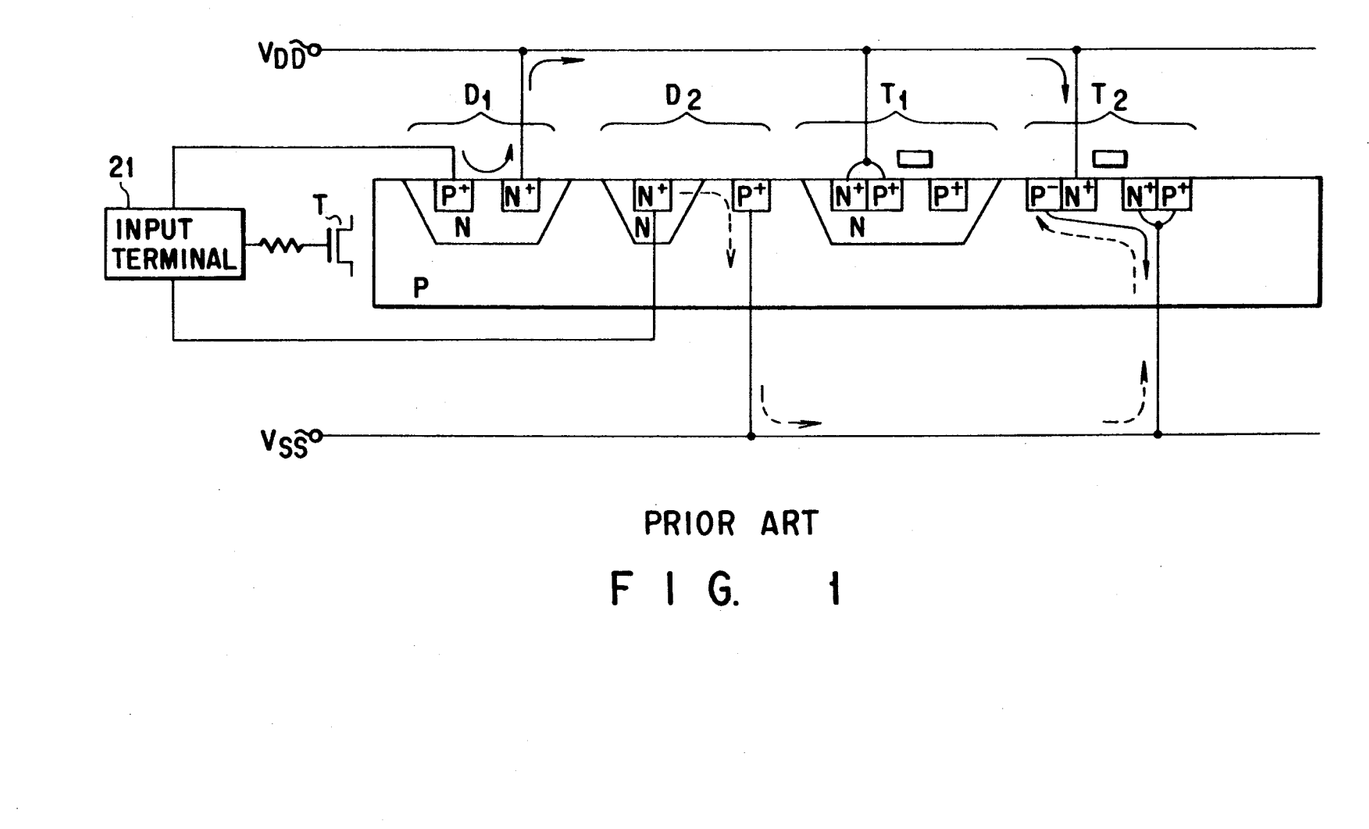
FIGS. 1 and 2 are cross sectional views showing conventional semiconductor devices.

The first type of input protection circuit has the structure shown in FIG. 1. In FIG. 1, reference numeral 21 is an input terminal, T: a MOSFET, $D_1$: a diode of $V_{DD}$ side, $D_2$: a diode of $V_{SS}$ side, $T_1$: a P channel type MOSFET provided around the input protection circuit, and $T_2$: an N channel type MOSFET provided around the input protection circuit.

According to this type of the input protection circuit, if a plus surge $V_{S+}$ (wherein $V_{SS}$ is used as a reference voltage, for example, $V_{SS}<V_{DD}<V_{S+}$) is inputted to the input terminal 21, the plus surge $V_{S+}$ passes through the diode $D_1$ of the $V_{DD}$ side, and is absorbed in the $V_{DD}$ line. Moreover, if a minus surge $V_{S-}$ (wherein $V_{SS}$ is used as a reference voltage, for example, $V_{S-}<V_{SS}<V_{DD}$) is inputted to the input terminal 21, the minus surge $V_{S-}$ passes through the diode $D_2$ of the $V_{SS}$ side, and is absorbed in the $V_{SS}$ line.

Figure 2:
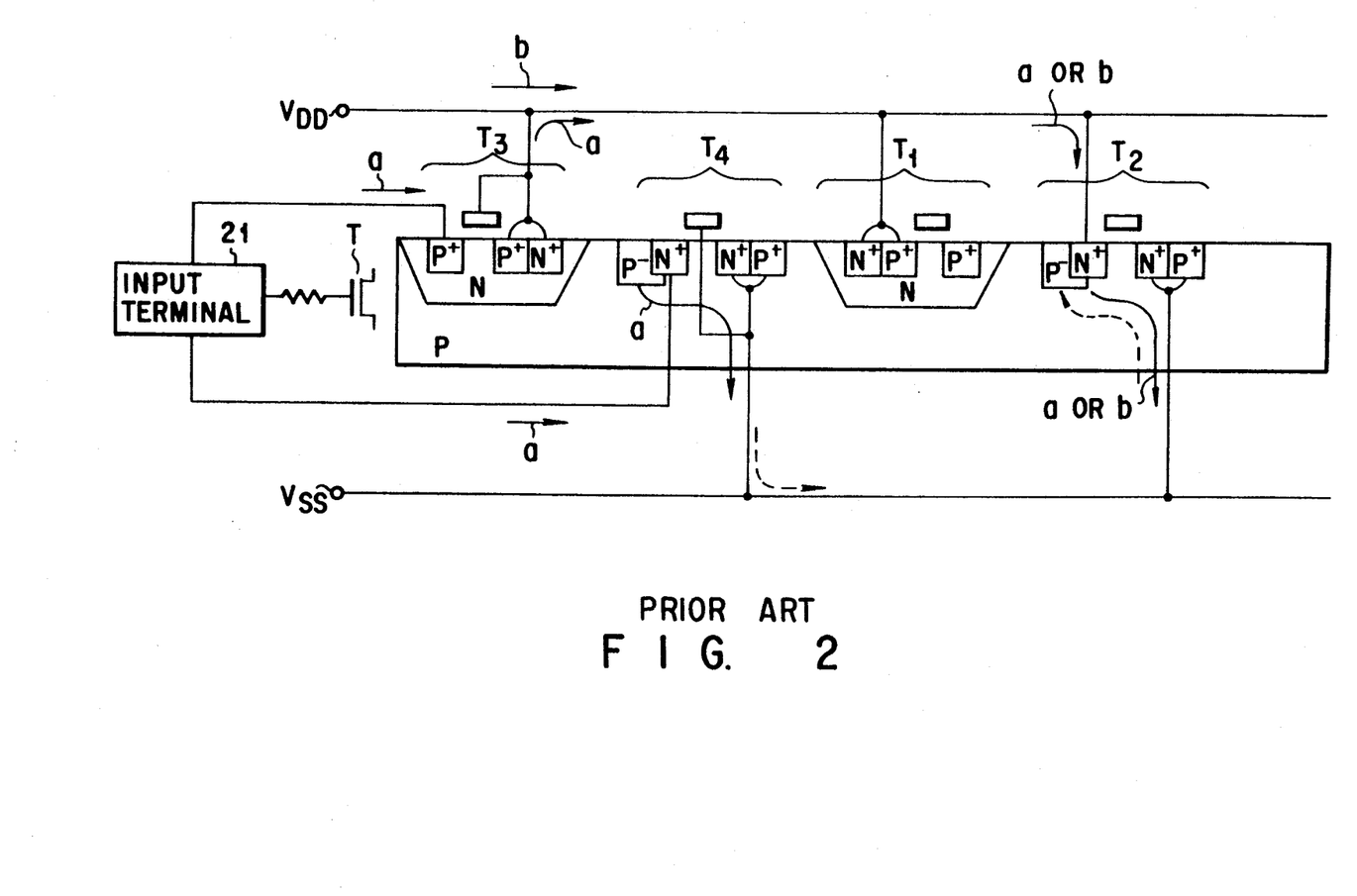

The second conventional input protection circuit has the structure shown in FIG. 2. In FIG. 2, $T_3$ is a dummy transistor of $V_{DD}$ side, and $T_4$ is a dummy transistor of $V_{SS}$ side.

According to this type of input protection circuit, if the plus surge $V_{S+}$ (wherein $V_{SS}$ is used as a reference voltage) is inputted to the input terminal 21, the plus surge $V_{S+}$ passes through the dummy transistor $T_3$ of the $V_{DD}$ side, and is absorbed in the $V_{DD}$ line. Moreover, if a minus surge $V_{S-}$ (wherein $V_{SS}$ is used as a reference voltage) is inputted to the input terminal 21, the plus surge $V_{S-}$ passes through the dummy transistor $T_4$ of the $V_{SS}$ side, and is absorbed in the $V_{SS}$ line.

The first conventional input protection circuit, however, has the following disadvantage.

That is, if the pulse surge $V_{S+}$ ($V_{SS}$=reference voltage) is inputted to the input terminal 21, the plus surge $V_{S+}$ is absorbed in the $V_{DD}$ line as shown by a solid line arrow. Thereafter, the plus surge $V_{S+}$ passes through the $V_{DD}$ line and finally reaches a drain of the N channel type MOSFET $T_2$. Then, the plus surge $V_{S+}$ passes through a Zener diode comprising $N^+$ and $P^-$, and is absorbed in the $V_{SS}$ line. As a result, current caused by the surge flows in the drain of the N channel type MOSFET $T_2$, and the drain is destroyed.

Similarly, in a case where the plus surge $V_{S+}$ ($V_{SS}$=reference voltage) is inputted to the $V_{DD}$ line, current caused by the surge flows in the drain of MOSFET $T_2$, and the drain is destroyed.

If the minus surge $V_{S-}$ ($V_{DD}$=reference voltage) is inputted to the input terminal 21, the minus surge $V_{S-}$ is absorbed in the $V_{SS}$ line as shown by a broken line arrow. Thereafter, the minus surge $V_{S-}$ passes through the $V_{SS}$ line and finally reaches to the drain of the N channel type MOSFET $T_2$. Then, the minus surge $V_{S-}$ passes through the Zener diode comprising $N^+$ and $P^-$, and is absorbed in the $V_{DD}$ line. As a result, current caused by the surge flows in the drain of the N channel type MOSFET $T_2$, and the drain is destroyed.

Similarly, in a case where the minus surge $V_{S-}$ ($V_{DD}$=reference voltage) is inputted to the $V_{SS}$ line, current caused by the surge flows in the drain of MOSFET $T_2$, and the drain is destroyed.

As mentioned above, according to the first conventional input protection circuit, MOSFET T can be protected. N channel MOSFET $T_2$ provided around the MOSFET T, however, cannot be protected with respect to the plus surge $V_{S+}$ ($V_{SS}$=reference voltage) to be inputted to the input terminal 21 or the $V_{DD}$ line and the minus surge $V_{S-}$ ($V_{DD}$=reference voltage) to be inputted to the input terminal 21.

As compared with the input protection circuit, the second conventional input protection circuit is improved in the following respect.

That is, if the plus surge $V_{S+}$ ($V_{SS}$=reference voltage) is inputted to the input terminal 21, as shown by an arrow a of a solid line, the plus surge $V_{S+}$ finally reaches the drain of the N channel type MOSFET $T_2$ and the drain of the dummy transistor $T_4$ of the $V_{SS}$ side. Then, the plus surge $V_{S+}$ passes through a Zener diode comprising $N^+$ and $P^-$ of the drain sides of the transistors $T_2$ and is $T_4$, and absorbed in the $V_{SS}$ line. As a result, in the drains of the transistors $T_2$ and $T_4$, density of current caused by the surge is relaxed and the drains are prevented from being destroyed. However, in this case, since the dimension of the dummy transistor $T_4$ of the $V_{SS}$ side must be made larger than that of the N channel type MOSFET $T_2$, this is disadvantageous to the integration of the element.

If the plus surge $V_{S+}$ ($V_{SS}$=reference voltage) is inputted from the $V_{DD}$ line, the plus surge $V_{S+}$ finally reaches the drain of the N channel type MOSFET $T_2$ as shown in an arrow b of a solid line. Then, the plus surge $V_{S+}$ passes through only Zener diode comprising $N^+$ and $P^-$ of the drain side of the transistor $T_2$, and is absorbed in the $V_{SS}$ line. Due to this, the drain of the N channel type MOSFET $T_2$ is destroyed.

Moreover, if the minus surge $V_{S-}$ ($V_{DD}$=reference voltage) is inputted to the input terminal 21, the minus surge $V_{S-}$ is absorbed in the $V_{SS}$ line as shown by an arrow of a broken line. Thereafter, the minus surge $V_{S-}$ passes through the $V_{SS}$ line and finally reaches to the drain of the N channel type MOSFET $T_2$. Then, the minus surge $V_{S-}$ passes through the Zener diode comprising $N^+$ and $P^-$, and absorbed in the $V_{DD}$ line. As a result, current caused by the surge flows in the drain of the N channel type MOSFET $T_2$, and the drain is destroyed.

Similarly, in a case where the minus surge $V_{S-}$ ($V_{DD}$=reference voltage) is inputted to the $V_{SS}$ line, current caused by the surge flows in the drain of MOSFET $T_2$, and the drain is destroyed.

As mentioned above, according to the second conventional input protection circuit, MOSFET T can be protected. An N channel MOSFET $T_2$ provided around the MOSFET T, however, cannot be protected relating to particularly the minus surge $V_{S-}$.

SUMMARY OF THE INVENTION

The present invention has been made in order to eliminate the above disadvantages, and an object of the present invention is to provide a semiconductor device wherein an input protection circuit can be formed without being enlarged and an N channel type MOSFET formed in the vicinity of the input protection circuit can be protected.

The semiconductor device of the present invention comprises a semiconductor substrate of a first conductive type and a MOS transistor of a second conductive type, and an input protection circuit. The MOS transistor of the second conductive type is formed in the semiconductor substrate, and its drain is connected to a first power source. A first impurity layer of the first conductive type is formed around the drain of the MOS transistor of the second conductive type. The input protection circuit comprises first and second diodes. The first diode has a second impurity layer of the first conductive type and a third impurity layer of the second conductive layer. The third impurity layer is connected to an input terminal, and the second impurity layer is connected to a second power source. The second diode has a fourth impurity layer of the first conductive type and a fifth impurity layer of the second conductive type. The fifth impurity layer is connected to the first power source, and the fourth impurity layer is connected to the second power source. Moreover, the impurity concentration of the fourth impurity layer is set to be higher than that of the first impurity layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

An embodiment of the present invention will be explained with reference to the drawings. In the explanation, the same reference numerals are added to the corresponding portions of FIGS. 1 and 2.

Figure 3:
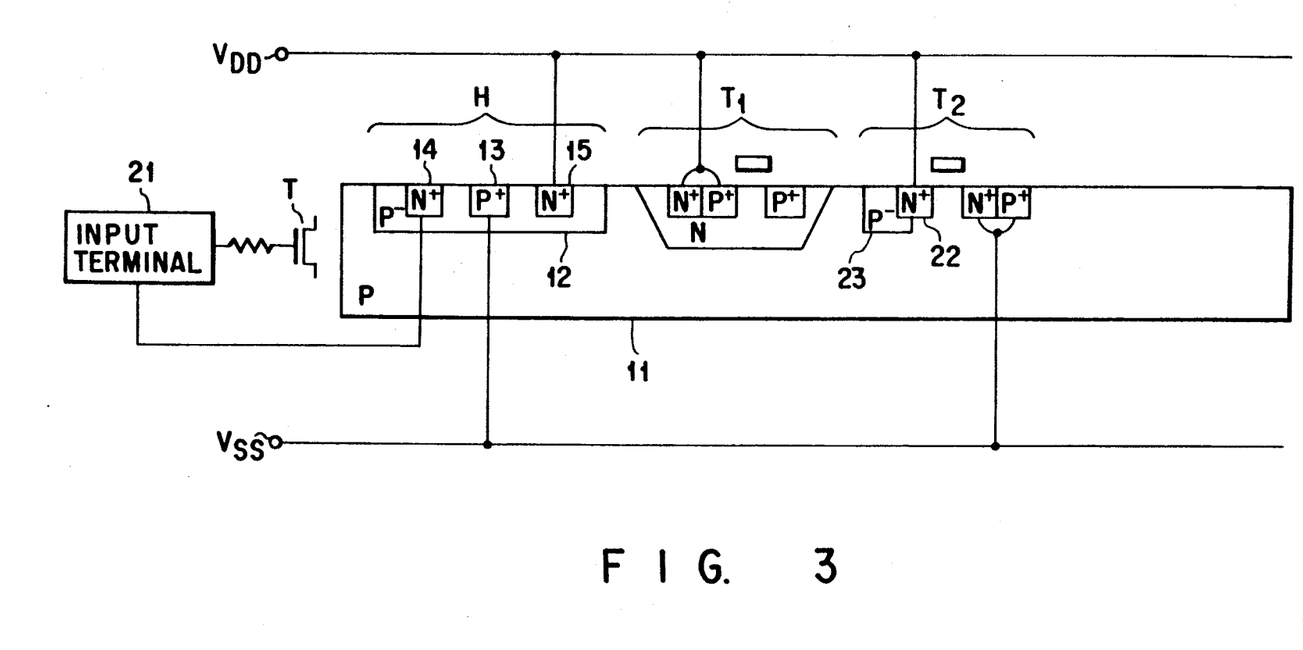
FIG. 3 is a cross sectional view showing a semiconductor device according to one embodiment of the present invention.

FIG. 3 shows a semiconductor device of the present invention in which an input protection circuit is formed. In the drawing, H denotes the input protection circuit. The structure of the input protection circuit of the present invention will be explained.

A $P^-$ impurity layer 12 is formed in a P type semiconductor substrate 11. $N^+$ impurity layers 14 and 15 are formed in the $P^-$ impurity layer 12. A $P^+$ impurity layer 13 is formed between the $N^+$ impurity layers 14 and 15 to have a constant distance from the impurity layers 14 and 15.

The $N^+$ impurity layer 14 is connected to an input terminal 21. The $N^+$ impurity layer 15 is connected to a $V_{DD}$ line (for example, a power source line). The $P^+$ impurity layer 13 is connected to a $V_{SS}$ line (for example, a ground line).

Figure 4:
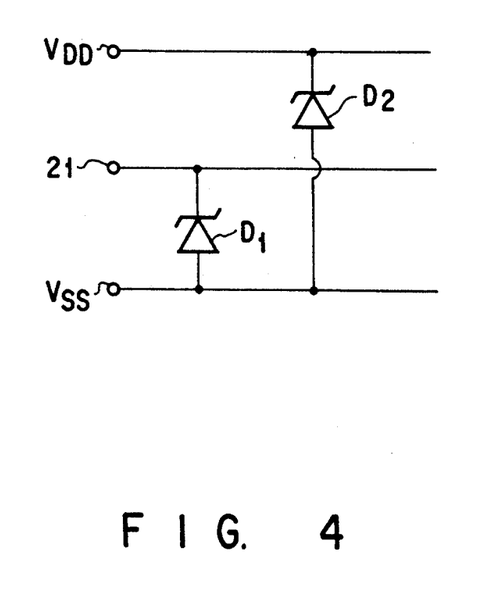
FIG. 4 is an equivalent circuit diagram of an input protection circuit of the semiconductor device of FIG. 3.

FIG. 4 shows an equivalent circuit of the protection circuit H. A cathode of a diode $D_1$ is connected to the input terminal 21, and an anode of the diode $D_1$ is connected to the $V_{SS}$ line. A cathode of a diode $D_2$ is connected to the $V_{DD}$ line, and an anode of the diode $D_2$ is connected to the $V_{SS}$ line. The anode of the diode $D_1$ and that of the diode $D_2$ are shared by the $P^+$ impurity layer 13.

Thereby, the diode $D_1$ is connected to only the $V_{SS}$ side of the input terminal 21. As a result, as compared with the case in which the diode or the transistor is connected to both $V_{SS}$ and $V_{DD}$ sides, the percentage of the input protection circuit, which occupies on the semiconductor substrate, can be reduced. Moreover, the current caused by Zener brake due to the surge can be sufficiently absorbed and dispersed if the dimension of the protection circuit H is set. Therefore, as compared with the prior art, strength against the surge can be improved.

Next, various cases in which surge voltage is generated will be explained.

Figure 5:
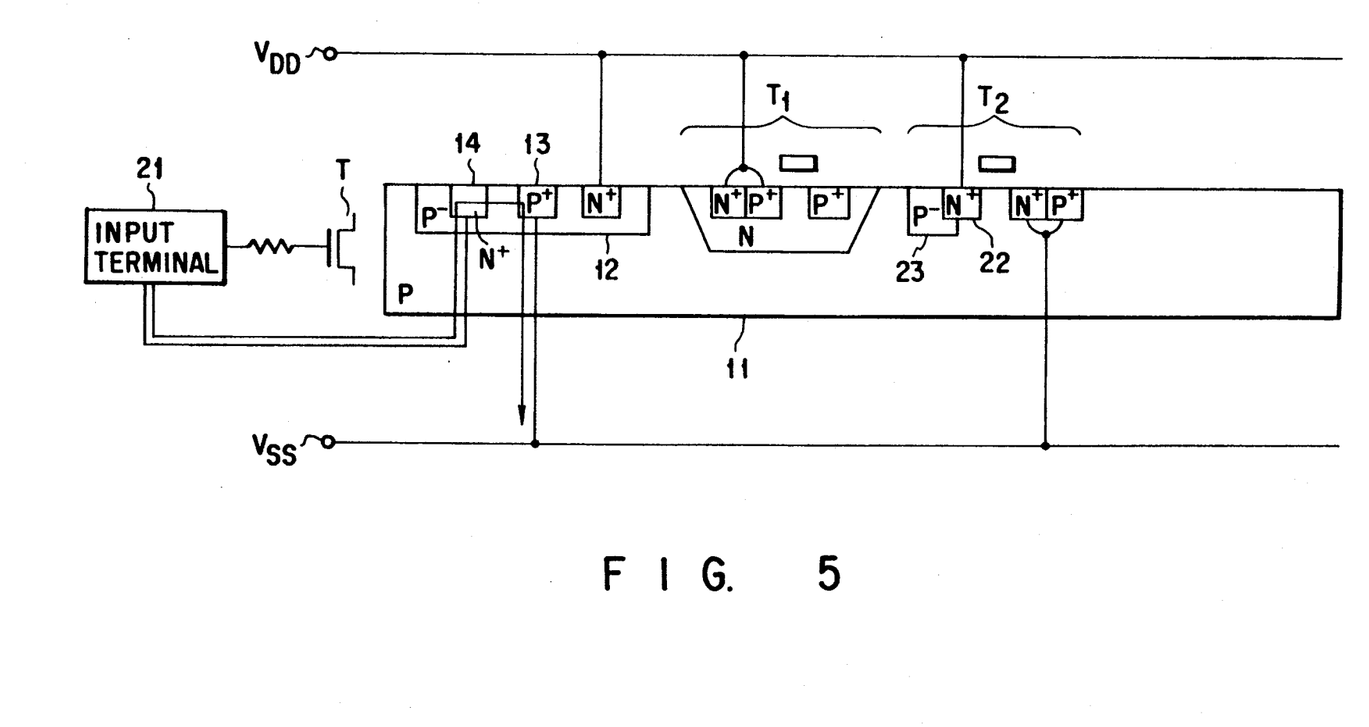
FIGS. 5 to 12 are views showing a passage of a surge current in the semiconductor device of FIG. 3.

FIG. 5 shows passage of the corresponding surge when a plus surge $V_{S+}$ (wherein $V_{SS}$ is a reference voltage, for example, $V_{SS} < V_{DD} < V_{S+}$) is inputted to the input terminal 21. In this case, the plus surge $V_{S+}$ passes through the Zener diode comprising $N^+$ impurity layer 14 and $P^-$ impurity layer 12, and is absorbed in the $V_{SS}$ line. Therefore, no surge current flows to the N channel MOSFET $T_2$.

Figure 6:
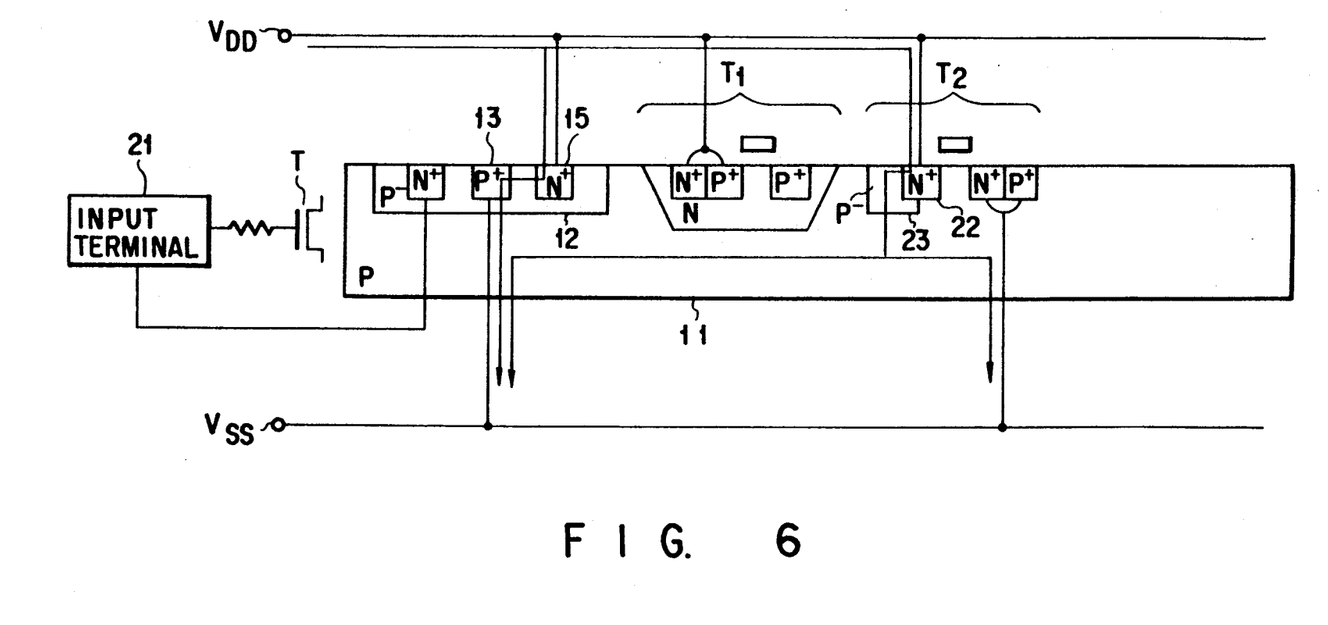

FIG. 6 shows a passage of the corresponding surge when the plus surge $V_{S+}$ (wherein $V_{SS}$ is a reference voltage) is inputted to the $V_{DD}$ line. In this case, the plus surge $V_{S+}$ passes through the Zener diode comprising $N^+$ impurity layer 15 of the protection circuit H and $P^-$ impurity layer 12, and is absorbed in the $V_{SS}$ line. At the same time, the plus surge $V_{S+}$ passes through the Zener diode comprising an $N^+$ impurity layer 22 of the N channel MOSFET $T_2$ and a $P^-$ impurity layer 23, and is absorbed in the $V_{SS}$ line.

Figure 7:
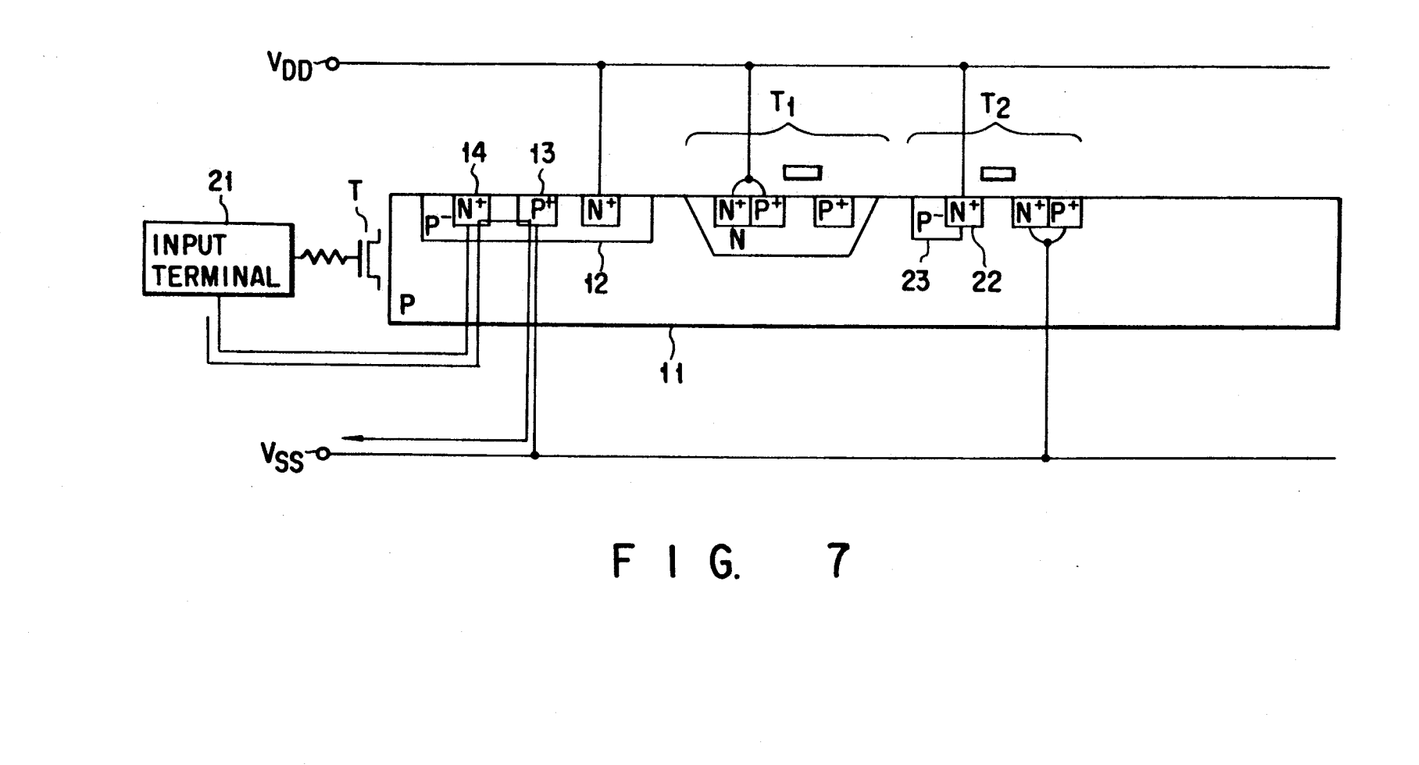

FIG. 7 shows a passage of the corresponding surge when a minus surge $V_{S-}$ (wherein $V_{SS}$ is a reference voltage) is inputted to the input terminal 21. In this case, the minus surge $V_{S-}$ passes through the diode comprising $N^+$ impurity layer 14 of the protection circuit and $P^-$ impurity layer 12, and is absorbed in the $V_{SS}$ line. That is, the surge current passes through the forward diode comprising $N^+$ impurity layer 14 of the protection circuit and $P^-$ impurity layer 12 from the $V_{SS}$ line, and flows up to the input terminal 21. Therefore, no surge current flows to the N channel MOSFET $T_2$.

Figure 8:
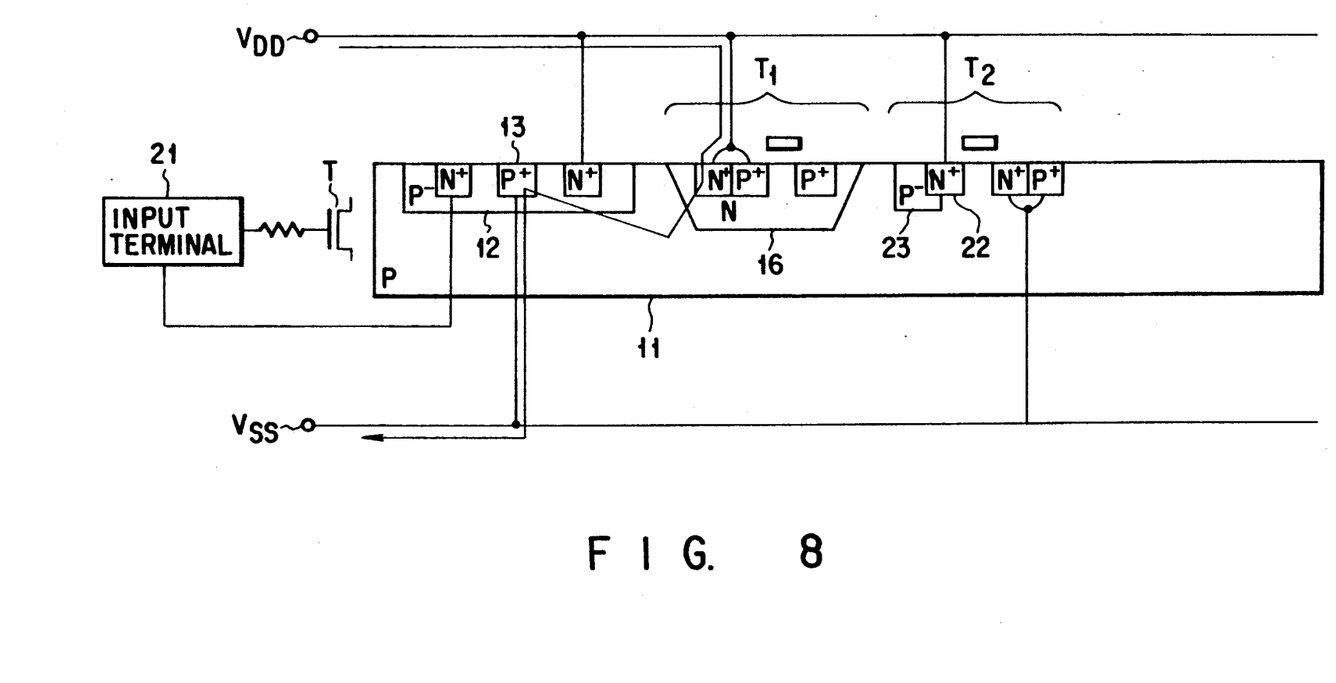

FIG. 8 shows a passage of the corresponding surge when a minus surge $V_{S-}$ (wherein $V_{SS}$ is a reference voltage) is inputted to the $V_{DD}$ line. In this case, the minus surge $V_{S-}$ passes through a diode comprising an N well 16 forming P channel MOSFET T1 and a P type substrate 11, and is absorbed in the $V_{SS}$ line. Therefore, no surge current flows to the N channel MOSFET $T_2$.

Figure 9:
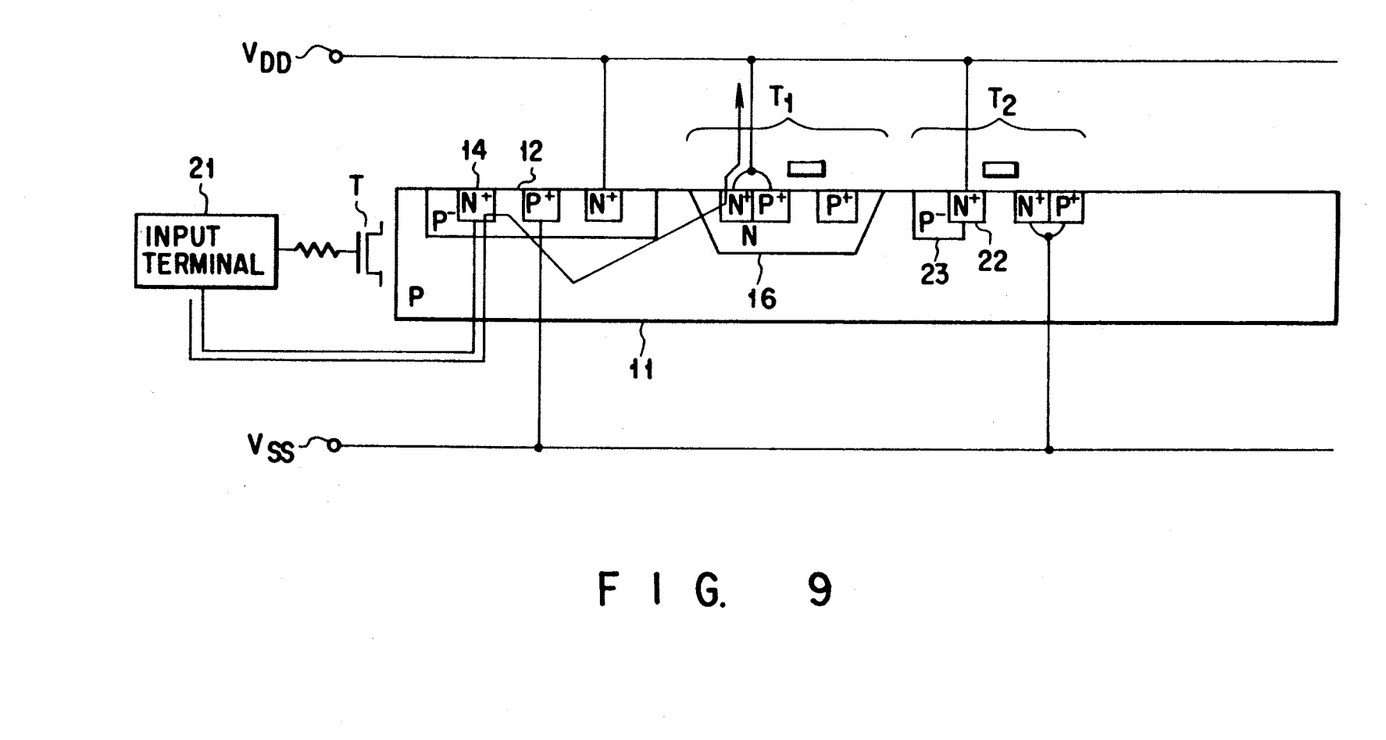

FIG. 9 shows a passage of the corresponding surge when a plus surge $V_{S+}$ (wherein $V_{DD}$ is a reference voltage, for example, $V_{S+} > V_{DD}$) is inputted to the input terminal 21. In this case, the plus surge $V_{S+}$ passes through the Zener diode comprising N+ impurity layer 14 of the protection circuit H and P− impurity layer 12. The plus surge $V_{S+}$ further passes through the forward diode comprising the P type substrate 11 and the N well 16, and is absorbed in the $V_{DD}$ line. Therefore, no surge current flows to the N channel MOSFET $T_2$.

Figure 10:
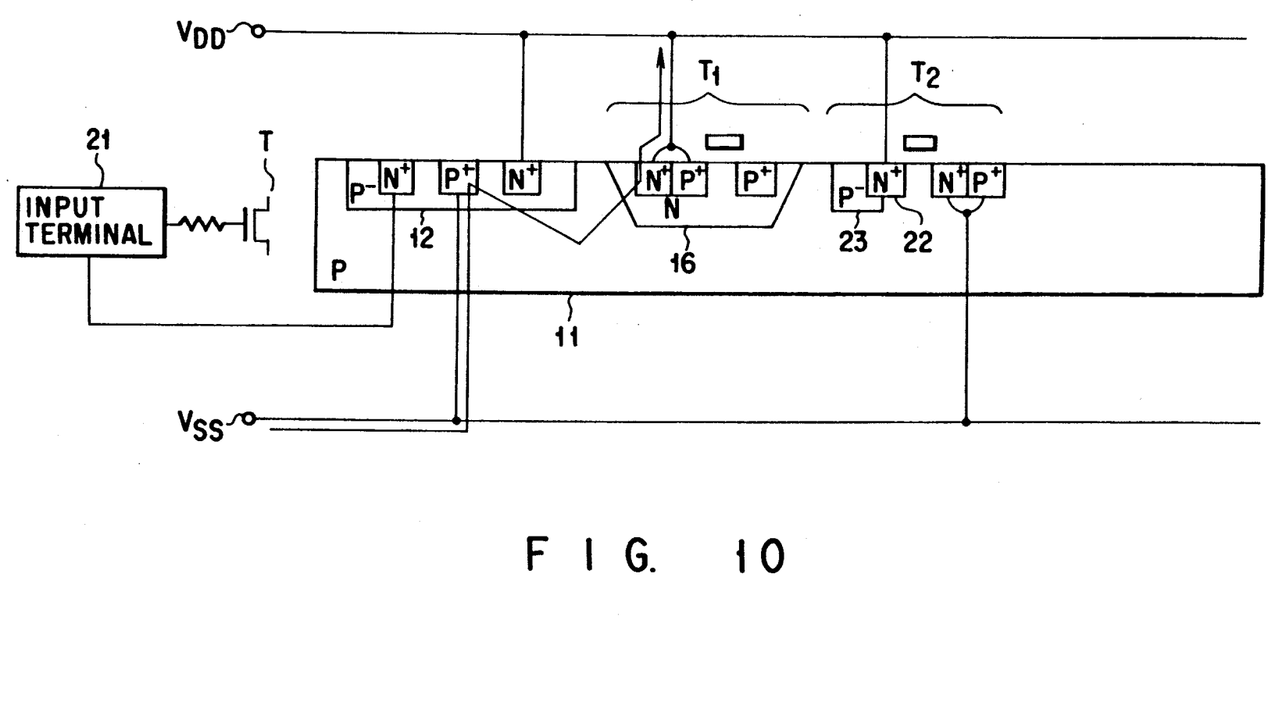

FIG. 10 shows a passage of the corresponding surge when a plus surge $V_{S+}$ (wherein $V_{DD}$ is a reference voltage) is inputted to the $V_{SS}$ line. In this case, the plus surge $V_{S+}$ passes through the forward diode comprising the P type substrate 11 and the N well 16, and is absorbed in the $V_{DD}$ line. Therefore, no surge current flows to the N channel MOSFET $T_2$.

Figure 11:
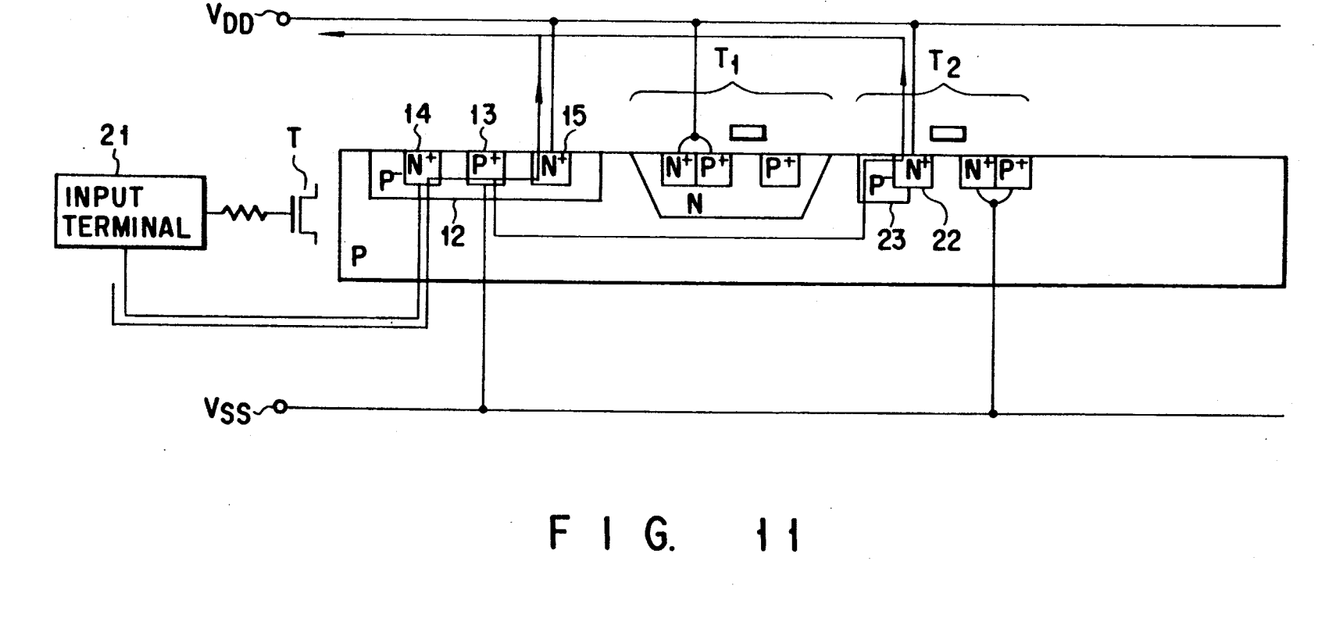

FIG. 11 shows a passage of the corresponding surge when the minus surge $V_{S-}$ (wherein $V_{DD}$ is a reference voltage) is inputted to the input terminal 21. In this case, the minus surge $V_{S-}$ flows the diode comprising the N+ impurity layer 14 of the protection circuit H and the P− impurity layer 12. Thereafter, the minus surge $V_{S-}$ passes through the Zener diode comprising the P− impurity layer 12 and the N+ impurity layer 15 and the Zener diode comprising the N+ impurity layer 22 of the N channel MOSFET $T_2$ and the P− impurity layer 23, and is absorbed in the $V_{DD}$ line.

Figure 12:
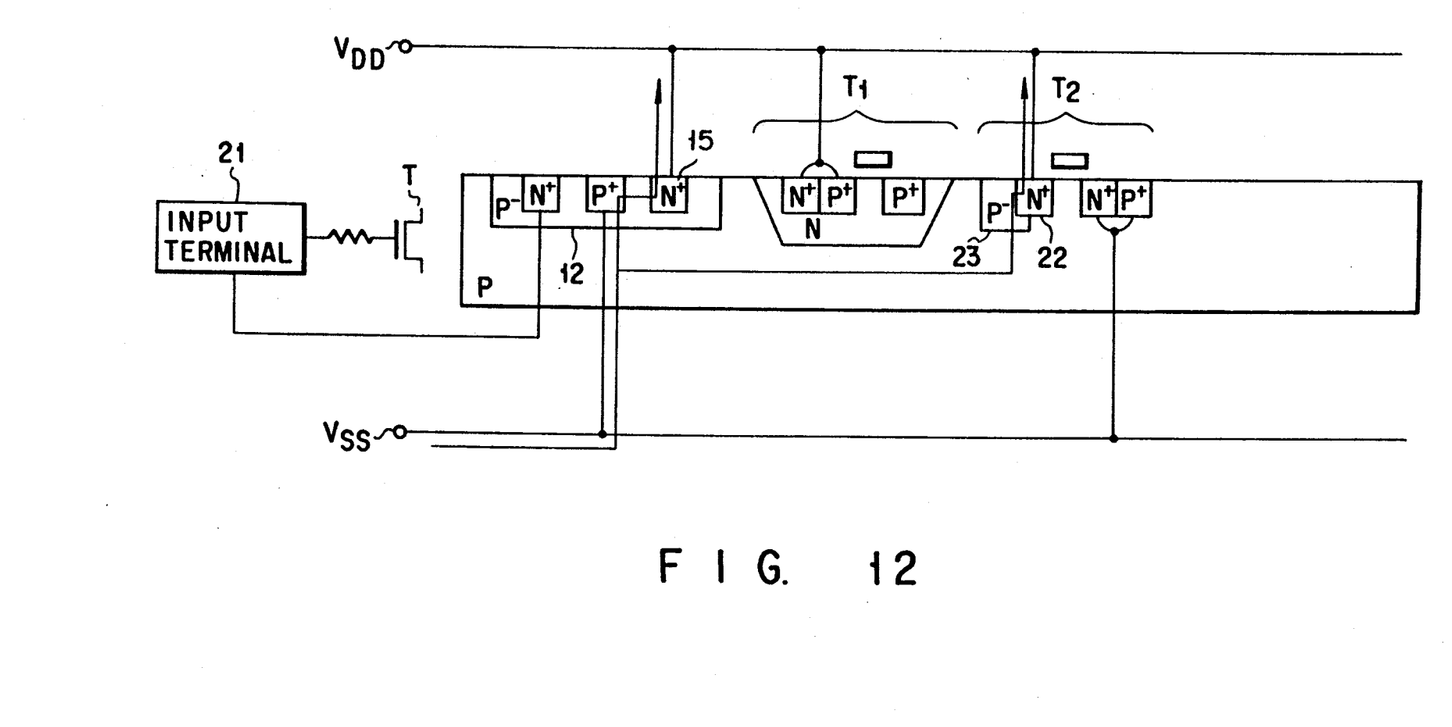

FIG. 12 shows a passage of the corresponding surge when a minus surge $V_{S-}$ (wherein $V_{DD}$ is a reference voltage) is inputted to the $V_{SS}$ line. In this case, the minus surge $V_{S-}$ passes through the Zener diode comprising the P− impurity layer 12 of the protection circuit H and the N+ impurity layer 15 and the Zener diode comprising the N+ impurity layer 22 of the N channel MOSFET $T_2$ and the P− impurity layer 23, and is absorbed in the $V_{DD}$ line.

As mentioned above, according to the semiconductor device having the input protection circuit of the present invention, since the surge current does not concentrate in the drain of the N channel MOSFET $T_2$, protection against the surge of the transistor can be improved. Moreover, since only one diode of the $V_{SS}$ side is connected to the input terminal 21, the protection circuit H is not unnecessarily enlarged. Therefore, the space on the semiconductor substrate can be effectively used. In other words, according to the present invention, the well to be formed in the semiconductor substrate may be only one well formed in the P− impurity layer 12. Due to this, the input protection circuit can be formed with half the area as compared with the prior art.

In three cases, that is, a) the plus surge $V_{S+}$ ($V_{SS}$ reference) to be inputted from the $V_{DD}$ line; b) the minus surge $V_{S-}$ ($V_{DD}$ reference) to be inputted from the input terminal 21; and c) the minus surge $V_{S-}$ ($V_{DD}$ reference) to be inputted from the $V_{SS}$ line, Zener current flows in the Zener diode comprising the N+ impurity layer 22 of the N channel MOSFET $T_2$ and the P− impurity layer 23. In this case, however, since the Zener current also flows in the protection diode $D_2$, the dimension of the Zener diode comprising the N+ impurity layer 22 and the P− impurity layer 23 is substantially enlarged and the MOSFET $T_2$ cannot be easily destroyed.

Moreover, in order to limit the Zener current flowing in the N channel type MOSFET $T_2$ and concentrate the Zener current in the protection circuit H, the following structure may be provided.

Figure 13:
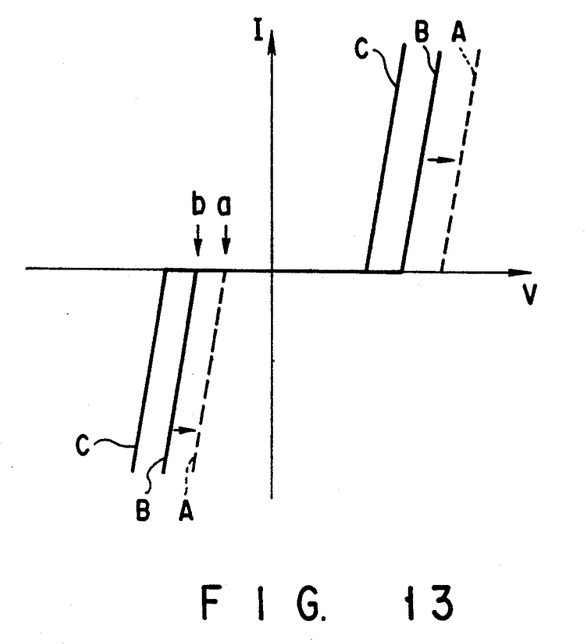
FIG. 13 is a graph showing a voltage-current characteristic of a diode forming the input protection circuit of the semiconductor device of FIG. 3.

That is, concentration of the P− impurity layer 12 of the protection circuit is higher than that of the P− impurity layer 23 of the N channel MOSFET $T_2$. In other words, as shown in FIG. 13, the Zener current (shown by an arrow a) of each of the N+ impurity layer 15 of the protection circuit H and the P− impurity layer 12 is lower than that (shown by an arrow b) of each of the N+ impurity layer 22 of the N channel MOSFET $T_2$ and the P− impurity layer 23. In FIG. 13, A shows a voltage-current characteristic curve of the diode comprising the N+ impurity layer 15 of the protection circuit H and the P− impurity layer 12. B shows a voltage-current characteristic curve of the diode comprising the N+ impurity layer 22 of the N channel MOSFET $T_2$ and the P− impurity layer 23. C shows a voltage-current characteristic curve of the diode comprising the N well 16 and the P type substrate 11.

Figure 14:
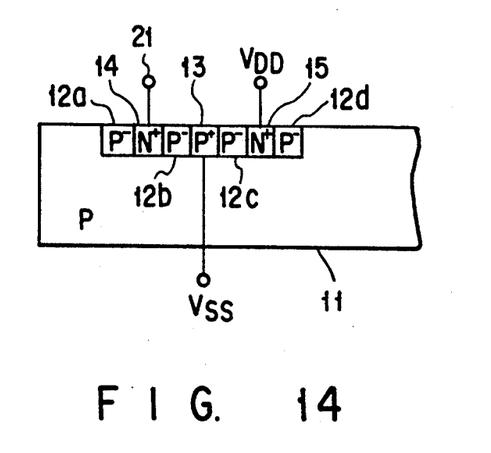
FIG. 14 is a cross sectional view showing a semiconductor device according to another embodiment of the present invention.

FIG. 14 shows a semiconductor device wherein an input protection circuit is formed according to another embodiment of the present invention. The structure of the input protection circuit will be briefly explained as follows.

In the P type substrate 11, P− impurity layers 12a, 12b, 12c, 12d and N+ impurity layers 14 and 15 are formed. The N+ impurity layer 14 is formed to be in contact with the P− impurity layer 12a and the P− impurity layer 12b. The N+ impurity layer 15 is formed to be in contact with the P− impurity layer 12c and the P− impurity layer 12d. The P+ impurity layer 13 is formed to be in contact with the P− impurity layer 12b and the P− impurity layer 12c. The N+ impurity layer 14 is connected to the input terminal 21 and the N+ impurity layer 15 is connected to the $V_{DD}$ line (for example, power source line), and the P+ impurity layer 13 is connected to the $V_{SS}$ line (for example, ground line).

The comparison between FIG. 4 and FIG. 14 will be explained as follows.

The diode $D_1$ comprises the P− impurity layer 12b and the N+ impurity layer 14. The diode $D_2$ comprises the P− impurity layer 12c and the N+ impurity 15. Impurity concentration of P− impurity layers 12b and 12c is higher than that of the P− impurity layer 23 (see FIG. 3).

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device, comprising:
   a semiconductor substrate of a first conductivity type;
   a MOS transistor of a second conductivity type, formed in said semiconductor substrate, having a first drain connected to a first power source and a first impurity layer of the first conductivity type contacting said drain; and
   an input protection circuit including:

a second impurity layer of the first conductivity type formed in said semiconductor substrate, third and fourth impurity layers of the second conductivity type formed and separated from each other in said second impurity layer, and a fifth impurity layer of the first conductivity type formed between said third impurity layer and said fourth impurity layer in said second impurity layer, wherein said third impurity layer is connected to said first power source, said fourth impurity layer is connected to an input terminal, said fifth impurity layer is connected to a second power source, and an impurity concentration of said fifth impurity layer is higher than an impurity concentration of said first impurity layer.

2. The semiconductor device according to claim 1, wherein said semiconductor substrate of the first conductivity type is a P-type semiconductor substrate and said MOS transistor of the second conductivity type is an N-channel MOS transistor.

3. The semiconductor device according to claim 1, wherein a diode is formed of said second and third impurity layers, and a second drain is formed of said second and fourth impurity layers.

4. A semiconductor device, comprising:

a semiconductor substrate of a first conductivity type;

a MOS transistor of second conductivity type, formed in the semiconductor substrate, having a first drain connected to a first power source and a first impurity layer of the first conductivity type formed in contact with the drain; and an input protection circuit including:

second through fifth impurity layers of the first conductivity type formed and separated from each other in the semiconductor substrate, a sixth impurity layer of a second conductivity type formed adjacent to the second and third impurity layers, a seventh impurity layer of the second conductivity type formed adjacent to the fourth and fifth impurity layers, and an eighth impurity layer of the first conductivity type formed adjacent to the third and fourth impurity layers, wherein the sixth impurity layer is connected to the first power source, the seventh impurity layer is connected to an input terminal, the eighth impurity layer is connected to a second power source, and an impurity concentration of the eighth impurity layer is higher than an impurity concentration of the first impurity layer.

5. The semiconductor device according to claim 4, wherein the semiconductor substrate of the first conductivity type is a P-type semiconductor substrate and the MOS transistor of the second conductivity type is an N-channel MOS transistor.

6. The semiconductor device, according to claim 4, wherein a diode formed of the second, third, and sixth impurity layers, and a second drain is formed of the fourth, fifth, and seventh impurity layers.

* * * * *